United States Patent
Cai

(10) Patent No.: US 11,121,183 B2
(45) Date of Patent: Sep. 14, 2021

(54) DISPLAY PANEL

(71) Applicant: Shenzhen China Star Optoelectronics Semiconductor Display Technology Co., Ltd., Guangdong (CN)

(72) Inventor: Zhenfei Cai, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 69 days.

(21) Appl. No.: 16/620,894

(22) PCT Filed: Nov. 11, 2019

(86) PCT No.: PCT/CN2019/117101
§ 371 (c)(1),
(2) Date: Dec. 10, 2019

(87) PCT Pub. No.: WO2021/027129
PCT Pub. Date: Feb. 18, 2021

(65) Prior Publication Data
US 2021/0050386 A1    Feb. 18, 2021

(30) Foreign Application Priority Data
Aug. 13, 2019 (CN) .......................... 201910742192.6

(51) Int. Cl.
*H01L 27/32* (2006.01)
*H01L 51/52* (2006.01)

(52) U.S. Cl.
CPC ...... *H01L 27/3206* (2013.01); *H01L 51/5218* (2013.01); *H01L 51/5221* (2013.01); *H01L 51/5265* (2013.01); *H01L 27/322* (2013.01); *H01L 27/3244* (2013.01); *H01L 2251/5315* (2013.01)

(58) Field of Classification Search
CPC ............. H01L 27/3206; H01L 51/5265; H01L 51/5218; H01L 51/5221; H01L 27/322; H01L 27/3244; H01L 27/3211
See application file for complete search history.

(56) References Cited

FOREIGN PATENT DOCUMENTS

CN          109904348 A  *  6/2019  ............. H01L 51/52

OTHER PUBLICATIONS

Machine Translation of CN 109904348 A.*

* cited by examiner

*Primary Examiner* — Anthony Ho
(74) *Attorney, Agent, or Firm* — Mark M. Friedman

(57) ABSTRACT

A display panel is provided, including a display area and a plurality of pixel units disposed in the display area. Each pixel unit includes at least one red pixel, at least one green pixel, and at least one blue pixel. The red pixel includes a red optical resonant cavity, and the green pixel includes a green optical resonant cavity. The display panel is provided to eliminate a color shift caused by a difference in light changes between different color pixels.

11 Claims, 2 Drawing Sheets

DISPLAY PANEL

FIELD OF DISCLOSURE

The present disclosure relates to the field of electronic displays, and more particularly to a display panel.

BACKGROUND

An active-matrix organic light-emitting diode (AMO-LED) has a high contrast ratio, wide viewing angles, and fast response times. It is expected to replace a liquid crystal display as a mainstream for a next-generation display.

After an existing AMOLE display panel is subjected to an optical testing, it is found that as a viewing angle increases, color points and brightness will change. Light changes in blue pixels are more pronounced than in red and green pixels. There is a difference between the changes in the three colors, which causes colors displayed on a screen to be color-shifted at a viewing angle. As the viewing angle changes, the difference in light changes between different colors will gradually increase, and the color shift will also increase.

Therefore, it is necessary to optimize the display panel in the prior art to eliminate the color shift caused by the difference in light changes between different color pixels.

SUMMARY OF DISCLOSURE

The present disclosure provides a display panel to eliminate the color shift caused by the difference in light changes between different color pixels.

In order to solve the above problem, the present disclosure provides a display panel, including a display area and a plurality of pixel units disposed in the display area. Each pixel unit includes at least one red pixel, at least one green pixel, and at least one blue pixel. The red pixel includes a red optical resonant cavity, and the green pixel includes a green optical resonant cavity.

According to one aspect of the present disclosure, the red optical resonant cavity and the green optical resonant cavity include semi-transparent reflective films, and material of the semi-transparent reflective films includes a semi-transparent reflective metal.

According to one aspect of the present disclosure, the semi-transparent reflective metal is selected from a group consisting of silver, platinum, nickel, and gold.

According to one aspect of the present disclosure, the red optical resonant cavity and the green optical resonant cavity are made of the same material, and a thickness of the red optical resonant cavity is greater than a thickness of the green optical resonant cavity.

According to one aspect of the present disclosure, a change of color and brightness of a light emitted by the red pixel after being processed by the red optical resonant cavity is the same as that of a light emitted by the blue pixel, and a change of color and brightness of a light emitted by the green pixel after being processed by the green optical resonant cavity is the same as that of the light emitted by the blue pixel.

According to one aspect of the present disclosure, the red pixel, the green pixel, and the blue pixel include a pixel drive circuit, a luminous layer, and a filter.

The pixel drive circuit includes a plurality of thin film transistors.

The luminous layer is disposed on the pixel drive circuit and includes an, a luminescent material, and a cathode.

The anode is electrically connected to the pixel drive circuit.

The luminescent material is disposed on the anode.

The cathode covers the luminescent material.

The filter is disposed on a light-exiting surface of the luminous layer, the filter includes a red color filter corresponding to the red pixel, a green color filter corresponding to the green pixel, and a blue color filter corresponding to the blue pixel.

According to one aspect of the present disclosure, the red optical resonant cavity is disposed between the luminous layer and the filter of the red pixel.

According to one aspect of the present disclosure, the anode is a reflective anode, the cathode is a transparent cathode, the light-exiting surface of the luminous layer is a surface of the cathode facing away from the anode, and the red optical resonant cavity is disposed between the cathode and the filter.

According to one aspect of the present disclosure, the anode is a transparent anode, the cathode is a reflective cathode, and the light-exiting surface of the luminous layer is a surface of the anode facing away from the cathode, and the red optical resonant cavity is disposed between the anode and the filter.

According to one aspect of the present disclosure, the green optical resonant cavity is disposed between the luminous layer and the filter of the green pixel.

According to one aspect of the present disclosure, the anode is a reflective anode, the cathode is a transparent cathode, the light-exiting surface of the luminous layer is a surface of the cathode facing away from the anode, and the green optical resonant cavity is disposed between the cathode and the filter.

According to one aspect of the present disclosure, the anode is a transparent anode, the cathode is a reflective cathode, and the light-exiting surface of the luminous layer is a surface of the anode facing away from the cathode, and the red optical resonant cavity is disposed between the anode and the filter.

In the present disclosure, the red optical resonant cavity is disposed in the red pixel, and the green optical resonant cavity is disposed in the green pixel. The resonant cavities enhance light rays that travel in a direction perpendicular to the light-exiting surface and filter out light rays that travel in other directions such that color changes of red light and green light is the same as that of blue light, thereby eliminating the color shift caused by the difference in light changes between different color pixels.

DETAILED DESCRIPTION

The structure and the technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, and etc., are only directions by referring to the accompanying drawings. Therefore, the used directional terms are used to describe and understand the present disclosure, but the present disclosure is not limited thereto. In the figures, the similar structural units are designated by the same reference numbers.

Figure 1:
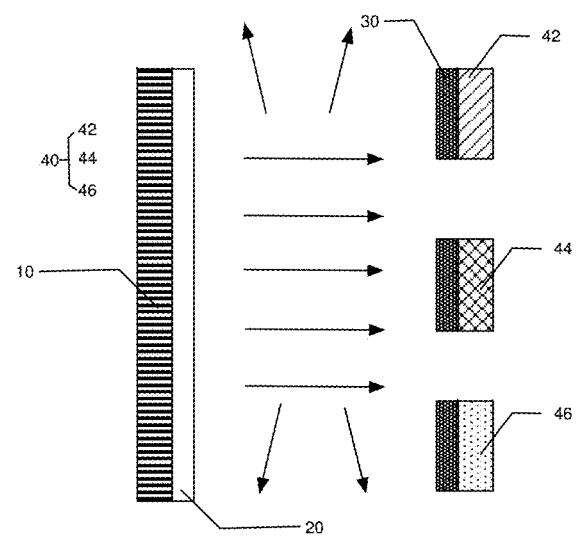
FIG. 1 is a schematic diagram of one pixel unit of a display panel in the prior art.

First, the prior art will be briefly described. Referring to FIG. 1, FIG. 1 is a schematic diagram of one pixel unit of a display panel in the prior art. The pixel unit includes a red pixel, a green pixel, and a blue pixel. The red pixel includes a cathode 10, a luminous layer 20, an anode 30, and a red color filter 42. The green pixel includes the cathode 10, the luminous layer 20, the anode 30, and a green color filter 44. The blue pixel includes the cathode 10, the luminous layer 20, the anode 30, and a blue color filter 46. The cathode 10 is a reflective cathode, and the anode 20 is a transparent anode. A portion of the light emitted by the luminous layer 20 is directly emitted through the anode 20, and the other portion is reflected by the cathode 10 and is emitted.

As a viewing angle increases, brightness and colors of the three colors of red, green, and blue will shift. Since the three rays of red, green, and blue have different wavelengths, they produce different color shifts at large viewing angles. Experiments have found that shifts of the brightness and color of blue light are the largest at large viewing angles, and shifts of the brightness and color of red light are the smallest. The shifts between the two is very different, resulting in a large chromatic aberration when viewing a screen at large viewing angles.

Thus, the present disclosure provides a display panel to eliminate color shifting due to differences in light variations between different color pixels.

Figure 2:
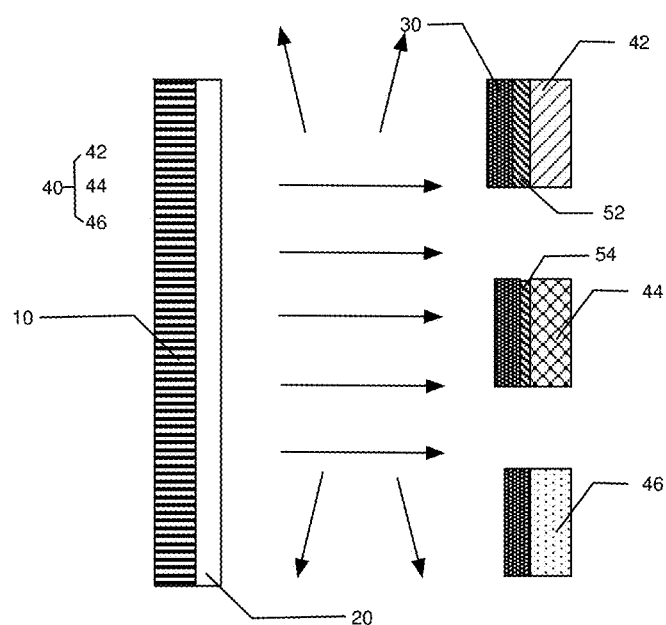
FIG. 2 is a schematic diagram of one pixel unit of a display panel of an embodiment of the present disclosure.
Figure 3:
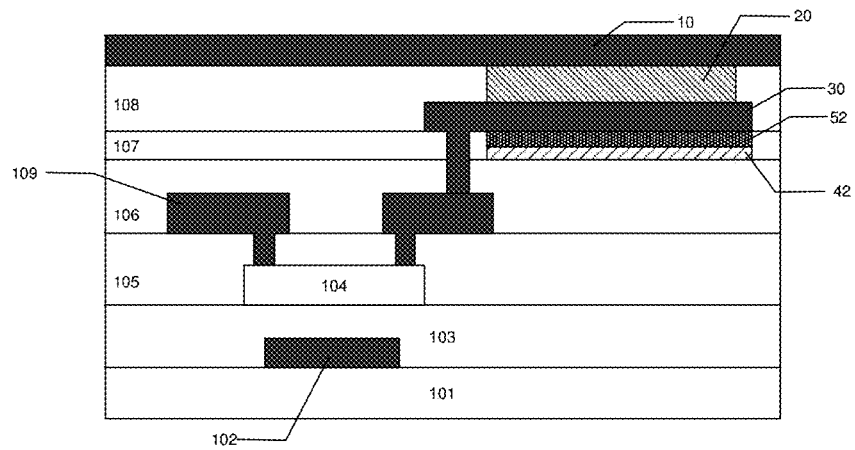
FIG. 3 is a schematic diagram of a red pixel of the embodiment of the present disclosure.

The present disclosure will be described in detail below with reference to the accompanying drawings. Referring to FIG. 2 and FIG. 3, FIG. 2 is a schematic diagram of one pixel unit of a display panel of an embodiment of the present disclosure, and FIG. 3 is a schematic diagram of a red pixel of the embodiment of the present disclosure.

The display panel in this embodiment includes a display area and a plurality of pixel units disposed in the display area. Each of the pixel units includes at least one red pixel, at least one green pixel, and at least one blue pixel. The red pixel includes a red optical resonant cavity 52, and the green pixel includes a green optical resonant cavity 54.

In this embodiment, the red optical resonant cavity 52 and the green optical resonant cavity 54 include semi-transparent reflective films. Material of the semi-transparent reflective films includes a semi-transparent reflective metal. The semi-transparent reflective metal is selected from a group consisting of silver, platinum, nickel, and gold. The semi-transparent reflective films and electrodes of a light-exiting surface constitute parallel resonant cavities. By adjusting parameters, such as thicknesses, materials, reflectivity of the semi-transparent reflective films and widths of the resonant cavities, a light travels along an axis of the resonant cavity can be enhanced, and a light travels in other directions is filtered out In this embodiment, the red optical resonant cavity 52 and the green optical resonant cavity 54 are made of the same material. Since a wavelength of the red light is greater than a wavelength of the green light, a thickness of the red optical resonant cavity 52 is greater than a thickness of the green optical resonant cavity 54.

In this embodiment, a change of color and brightness of a light emitted by the red pixel after being processed by the red optical resonant cavity 52 is the same as that of a light emitted by the blue pixel, and a change of color and brightness of a light emitted by the green pixel after being processed by the green optical resonant cavity 54 is the same as that of the light emitted by the blue pixel. A shift of the brightness and color of the blue light is the largest at a large viewing angle. After the red optical resonant cavity and the green optical resonant cavity are added, shifts of brightness and color of the red and green light tend to coincide with that of the blue light, which improves the color shift caused by the change of the viewing angle.

Referring to FIG. 2 and FIG. 3, one embodiment of the present disclosure is shown in FIG. 2 and FIG. 3. The display panel is a bottom-emitting display panel. The red pixel, green pixel and blue pixel include a pixel drive circuit, a luminous layer, and a filter 40.

Referring to FIG. 3, the pixel drive circuit includes a plurality of thin film transistors. In this embodiment, each of the thin film transistors includes a substrate 101, a light shielding metal 102, a buffer layer 103, an active region 104, a gate stacked layer, an interlayer dielectric layer 105, a source/drain metal layer 109, and a planarization layer 106.

The luminous layer is located above the pixel drive circuit and includes an anode 30, a luminescent material 20, and a cathode 10. The anode 30 is electrically connected to the pixel drive circuit. The luminescent material 20 is disposed on the anode 30. The cathode 10 covers the luminescent material.

The filter 40 is disposed on a light-exiting surface of the luminous layer. The filter includes a red color filter 42 corresponding to the red pixel, a green color filter 44 corresponding to the green pixel, and a blue color filter 46 corresponding to the blue pixel.

The following disclosure will be described by taking red pixel as an example.

In this embodiment, the display panel is a bottom-emitting display panel. As shown in FIG. 3, the anode 30 is a transparent anode made of a material having a higher work function such as indium tin oxide. The cathode 10 is a reflective cathode made of a material having high reflectivity and low resistivity, such as aluminum, silver, or the like. The light-exiting surface of the luminous layer is a surface of the anode 30 facing away from the cathode. The red optical resonant cavity 52 is disposed between the anode 30 and the red filter 42. Specifically, an insulating layer 107 is disposed between a pixel definition layer 108 and the planarization layer 106. The insulating layer 107 has an opening. The opening is disposed directly below the anode 30. The red color filter 42 is disposed at a bottom of the opening, and the red optical resonant cavity 52 is disposed between the red filter 42 and the anode 30.

Figure 4:
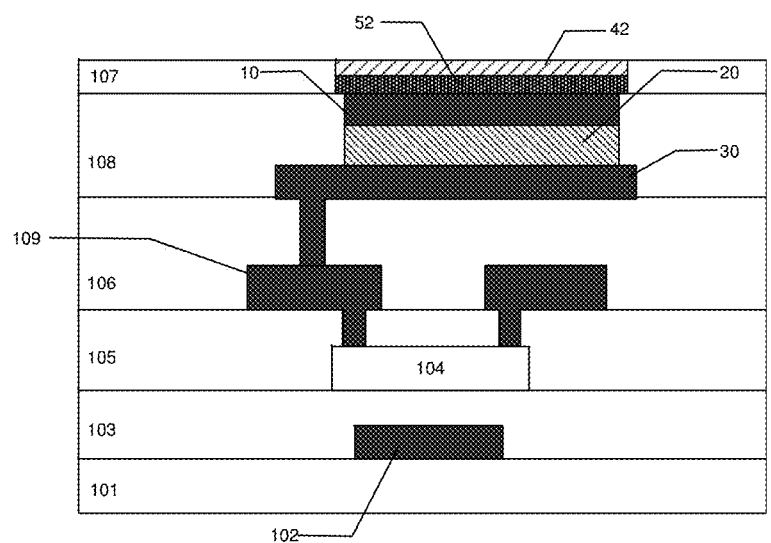
FIG. 4 is a schematic diagram of a red pixel of another embodiment of the present disclosure.

In another embodiment of the present disclosure, the display panel is a top-emitting display panel. As shown in FIG. 4, the anode 30 is a reflective anode made of a material having high reflectivity and low resistivity, such as aluminum, silver, or the like. The cathode 10 is a transparent cathode made of a material having a higher work function such as indium tin oxide. The light-exiting surface of the luminous layer is a surface of the cathode 10 facing away from the anode. The red optical resonant cavity 52 is disposed between the cathode 10 and the filter 42. Specifically, an insulating layer 107 is disposed on the pixel definition layer 108. The insulating layer 107 has an opening. The opening is disposed directly above the anode 30. The red optical resonant cavity 52 is disposed at a bottom of the opening, and the red color filter 42 is disposed above the red optical resonant cavity 52.

Similarly, the green pixel can also adopt a bottom-emitting structure or a top-emitting structure. The structure of the bottom-emitting display panel is shown in FIG. 3. The anode 30 is a transparent anode made of a material having a higher work function such as indium tin oxide. The cathode 10 is a reflective cathode made of a material having high reflectivity and low electrical resistivity, such as aluminum, silver, or the like. The light-exiting surface of the luminous layer is a surface of the anode 30 facing away from the cathode. The green optical resonant cavity 54 is disposed between the anode 30 and the green color filter 44. Specifically, an insulating layer 107 is disposed between the pixel definition layer 108 and the planarization layer 106. The insulating layer 107 has an opening. The opening is disposed directly below the anode 30. The green color filter 44 is disposed at a bottom of the opening. The green optical resonant cavity 54 is disposed between the green filter 44 and the anode 30.

In another embodiment of the present disclosure, the display panel is a top-emitting display panel. As shown in FIG. 4, the anode 30 is a reflective anode made of a material having high reflectivity and low resistivity, such as aluminum, silver, or the like. The cathode 10 is a transparent cathode made of a material having a higher work function such as indium tin oxide. The light-exiting surface of the luminous layer is a surface of the cathode 10 facing away from the anode. The green optical resonant cavity 54 is disposed between the cathode 10 and the green color filter 44. Specifically, an insulating layer 107 is disposed on the pixel definition layer 108. The insulating layer 107 has an opening. The opening is disposed directly above the anode 30. The green optical resonant cavity 54 is disposed at a bottom of the opening. The green color filter 44 is disposed above the red optical resonant cavity 52.

In the present disclosure, the red optical resonant cavity is disposed in the red pixel, and the green optical resonant cavity is disposed in the green pixel. The resonant cavities enhance light rays that travel in a direction perpendicular to the light-exiting surface and filter out light rays that travel in other directions such that color changes of red light and green light is the same as that of blue light, thereby eliminating the color shift caused by the difference in light changes between different color pixels.

The present disclosure has been described with preferred embodiments thereof and it is understood that many changes and modifications to the described embodiments can be carried out without departing from the scope and the spirit of the disclosure that is intended to be limited only by the appended claims.

What is claimed is:

1. A display panel, comprising a display area and a plurality of pixel units disposed in the display area, wherein each pixel unit comprises at least one red pixel, at least one green pixel, and at least one blue pixel; and
    wherein the red pixel comprises a red optical resonant cavity, and the green pixel comprises a green optical resonant cavity;
    wherein the red pixel, the green pixel, and the blue pixel comprise a pixel drive circuit, a luminous layer, and a filter;
    the pixel drive circuit comprises a plurality of thin film transistors;
    the luminous layer is disposed on the pixel drive circuit and comprises:
        an anode electrically connected to the pixel drive circuit;
        a luminescent material disposed on the anode; and
        a cathode covering the luminescent material; and
    wherein the filter is disposed on a light-exiting surface of the luminous layer, the filter comprises a red color filter corresponding to the red pixel, a green color filter corresponding to the green pixel, and a blue color filter corresponding to the blue pixel.

2. The display panel as claimed in claim 1, wherein the red optical resonant cavity and the green optical resonant cavity comprise semi-transparent reflective films, and material of the semi-transparent reflective films comprises a semi-transparent reflective metal.

3. The display panel as claimed in claim 2, wherein the semi-transparent reflective metal is selected from a group consisting of silver, platinum, nickel, and gold.

4. The display panel as claimed in claim 2, wherein the red optical resonant cavity and the green optical resonant cavity are made of the same material, and a thickness of the red optical resonant cavity is greater than a thickness of the green optical resonant cavity.

5. The display panel as claimed in claim 4, wherein a change of color and brightness of a light emitted by the red pixel after being processed by the red optical resonant cavity is the same as that of a light emitted by the blue pixel, and a change of color and brightness of a light emitted by the green pixel after being processed by the green optical resonant cavity is the same as that of the light emitted by the blue pixel.

6. The display panel as claimed in claim 1, wherein the red optical resonant cavity is disposed between the luminous layer and the filter of the red pixel.

7. The display panel as claimed in claim 6, wherein the anode is a reflective anode, the cathode is a transparent cathode, the light-exiting surface of the luminous layer is a surface of the cathode facing away from the anode, and the red optical resonant cavity is disposed between the cathode and the filter.

8. The display panel as claimed in claim 6, wherein the anode is a transparent anode, the cathode is a reflective cathode, and the light-exiting surface of the luminous layer is a surface of the anode facing away from the cathode, and the red optical resonant cavity is disposed between the anode and the filter.

9. The display panel as claimed in claim 1, wherein the green optical resonant cavity is disposed between the luminous layer and the filter of the green pixel.

10. The display panel as claimed in claim 9, wherein the anode is a reflective anode, the cathode is a transparent cathode, the light-exiting surface of the luminous layer is a surface of the cathode facing away from the anode, and the green optical resonant cavity is disposed between the cathode and the filter.

11. The display panel as claimed in claim 9, wherein the anode is a transparent anode, the cathode is a reflective cathode, and the light-exiting surface of the luminous layer is a surface of the anode facing away from the cathode, and the red optical resonant cavity is disposed between the anode and the filter.

* * * * *